United States Patent [19]
Yu

[11] 4,300,060
[45] Nov. 10, 1981

[54] SIGNAL PROGRAMMABLE MULTIPLE FUNCTION FLIP-FLOP

[75] Inventor: Ruey J. Yu, Flint, Mich.

[73] Assignee: General Motors Corporation, Detroit, Mich.

[21] Appl. No.: 102,249

[22] Filed: Dec. 10, 1979

[51] Int. Cl.³ .................. H03K 3/356; H03K 3/037
[52] U.S. Cl. ......................... 307/272 A; 307/279; 307/291
[58] Field of Search ........... 307/221 R, 221 C, 223 R, 307/223 C, 272 A, 276, 291, 279; 328/206, 195, 196, 200

[56] References Cited

U.S. PATENT DOCUMENTS

| | | | |
|---|---|---|---|
| 3,401,273 | 9/1968 | May | 307/291 |
| 3,541,356 | 11/1970 | Lagemann | 307/289 |
| 3,585,410 | 6/1971 | Burtness | 307/272 A |
| 3,622,803 | 11/1971 | Cooper et al. | 307/272 A |
| 3,835,337 | 9/1974 | Foltz | 307/279 |

*Primary Examiner*—John Zazworsky
*Attorney, Agent, or Firm*—Robert M. Sigler

[57] ABSTRACT

A signal programmable, multiple function flip-flop comprises a clocked, RS master-slave flip-flop with additional logic elements responsive to the signals on a pair of programming inputs to program the operation of the flip-flop as an RS, JK, D or T flip-flop.

2 Claims, 2 Drawing Figures

SIGNAL PROGRAMMABLE MULTIPLE FUNCTION FLIP-FLOP

BACKGROUND OF THE INVENTION

A flip-flop is one of the basic sequential circuits in digital electronics. It has many important applications in memory registers, counters, dividers, sequencers and microprocessors. However, although all flip-flops are capable of storing a single binary bit of information, there are many varieties of flip-flops, which may be divided into four basic kinds: RS, JK, D and T.

A basic RS flip-flop or latch comprises a pair of NOR gates each having an input connected to the output of the other. This basic RS flip-flop may have additional logic elements and a clock input added to form a clocked RS flip-flop; and two clocked RS flip-flops may be combined to form a clocked, masterslave RS flip-flop. An RS flip-flop has the advantage of being the simplest flip-flop but has the disadvantage of having an undefined state with one of the four possible combinations of inputs. A JK flip-flop is basically a clocked RS flip-flop with several logical connections which define the undefined state of the RS flip-flop and allow all possible combinations of inputs. A D flip-flop is one with only one data input in which the output follows that data input with each clock pulse. A T flip-flop has a single toggle input; and, when the toggle input is supplied with a logic 1 the flip-flop changes state or toggles each time it receives a clock pulse.

It is well known that the different kinds of flip-flop are closely related and many can be formed from one or more of the others with specific external connections and/or additional logic elements. For example, a T flip-flop may be formed from a JK flip-flop by tying both inputs together; and a D flip-flop may be formed from an RS or JK flip-flop by tying one input to the other through an inverter. However, each of these transformations must be made individually by an actual physical connection and/or the addition of another logic element. It would appear to be advantageous to have a universal flip-flop which could be externally programmed by means of one or more logic signals to operate as any one of the four basic kinds of flip-flops. Such a universal, signal programmable flip-flop would be a versatile addition to the area of programmed digital electronics in that it would enable a computer or similar digital device to change its own internal circuitry in response to software instructions. In addition, a universal flip-flop may result in inventory or assembly savings in more conventional flip-flop use in digital electronic circuitry.

SUMMARY OF THE INVENTION

Therefore, it is an object of this invention to provide a signal programmable, multiple function flip-flop.

This object and other related objects are achieved in the logical and electronic circuit arrangements shown in the accompanying drawings and following description of a preferred embodiment. The apparatus basically comprises a clocked, master-slave RS flip-flop with additional logical elements responsive to signal input conditions on a pair of signal input lines to operate as an RS, JK, D or T flip-flop.

DESCRIPTION OF A PREFERRED EMBODIMENT

Figure 1:
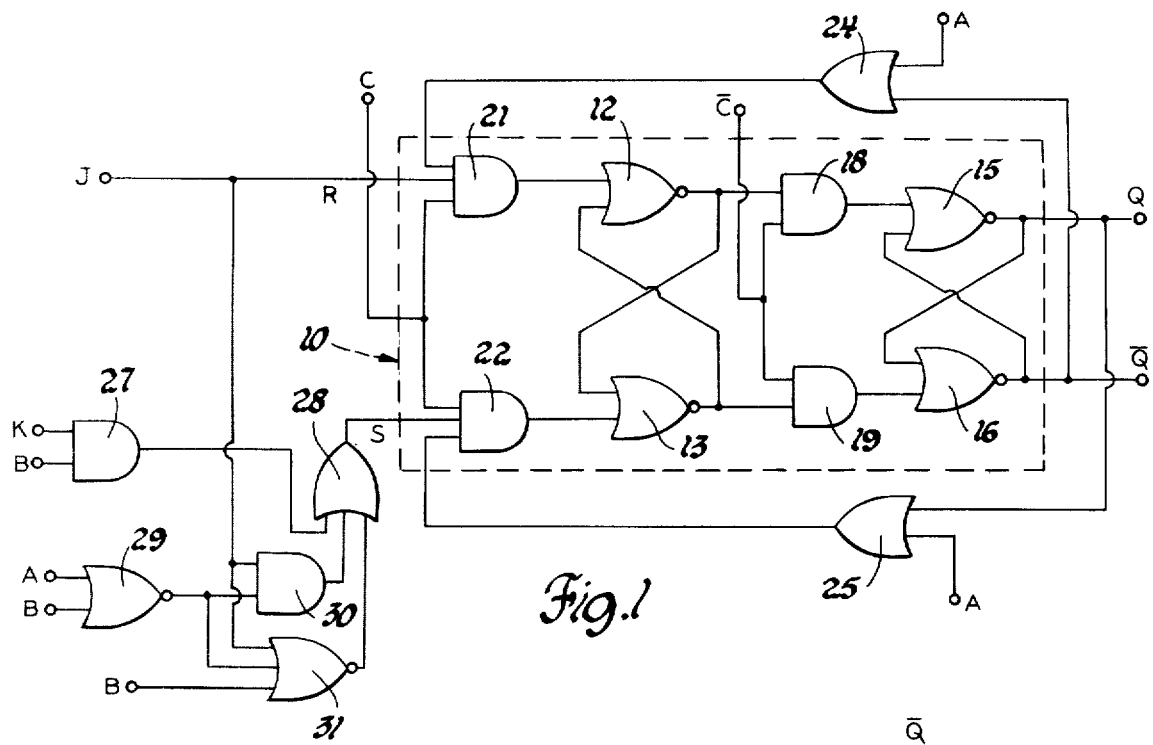
FIG. 1 is a logic diagram of a preferred embodiment of this invention.

Referring to FIG. 1, a clocked, master-slave RS flip-flop is indicated generally at 10. This flip-flop 10 comprises a first pair of NOR gates 12 and 13, each of which has an output connected to one input of the other and a second pair of NOR gates 15 and 16, each of which has an output connected to one input of the other. The output of NOR gate 12 is further connected to one input of an AND gate 18 which has an output connected to the other input of NOR gate 15. The output of NOR gate 13 is connected to one input of an AND gate 19 which has an output connected to the other input of NOR gate 16. The other inputs of AND gates 18 and 19 are connected to a not-C clock input $\overline{C}$. Apparatus 10 further includes a pair of AND gates 21 and 22, each having an input connected to a clock input C. AND gate 21 further has an R input and an output connected to the other input of NOR gate 12. AND gate 22 further has an S input and an output connected to the other input of NOR gate 13. Further, the output of NOR gate 15 is labelled Q and the output of NOR gate 16 is labelled not-Q or $\overline{Q}$. The apparatus as described to this point is well known in the prior art.

RS flip-flop 10 is modified by the additional logic elements to be described below. An OR gate 24 has an input labelled A, another input connected to the output of NOR gate 16 and an output connected to a third input of AND gate 21. An OR gate 25 has an input labelled A, another input connected to the output of NOR gate 15 and an output connected to a third input of AND gate 22. When a logic 1 is applied to the inputs labelled A of OR gates 24 and 25, the flip-flop as described to this point operates as an RS flip-flop; but a logic 0 on inputs A transforms the flip-flop from an RS to a JK flip-flop. Although the inputs labelled A are shown as separate inputs for the sake of simplicity in the drawing, there would actually be only one input to the circuit chip labelled A with internal connections made to several elements on the chip. Input A is one of the two programming inputs for the flip-flop.

Further logic includes an AND gate 27 having an input labelled K, another labelled B and an output connected to a first input of an OR gate 28. A NOR gate 29 has a first input labelled A, a second input labelled B and an output connected to one input of an AND gate 30. The other input of AND gate 30 is connected to the R input of AND gate 21, which is also labelled input J; while the output of AND gate 30 is connected to a second input of OR gate 28. Finally, a NOR gate 31 has a first input labelled B, a second input connected to the output of NOR gate 29, a third input connected to input J and an output connected to the third input of OR gate 28. The output of OR gate 28 is connected to the S input of AND gate 22. These additional logic elements 27-31 enable the flip-flop to be operated as a D or a T flip-flop. The actual data inputs for the flip-flop are those labelled J and K, with the J input serving as the T or D input. The signal programming inputs are labelled A and B allow a total of four programming signal combinations to control the four types of flip-flop operation.

In operation, an RS flip-flop requires a logic 1 on inputs A and B. The logic 1 on input B causes logic 0 outputs from NOR gates 29 and 31 and AND gate 30 but actuates AND gate 27 to follow its K input, which is fed through AND gate 27 and OR gate 28 to AND gate 22. Thus, the K input is connected to the S input of the RS flip-flop 10. A logic 1 on input A causes a logic 1 to be supplied from OR gates 24 and 25 to the inputs of AND gates 21 and 22, respectively, regardless of the state of outputs Q and $\overline{Q}$; and the flip-flop thus operates as an RS flip-flop.

Operation as a JK flip-flop requires a logic 0 on input A and a logic 1 on input B. The effect of a logic 1 on input B is, as previously described, to connect the K input to the S input; and a logic 0 on input A allows OR gates 24 and 25 to connect the outputs of NOR gate 15 and 16 to AND gates 22 and 21, respectively.

Operation as a T flip-flop requires a logic 0 on inputs A and B. A logic 0 on input B causes a logic 0 output from AND gate 27 and thus isolates input K from the flip-flop. The logic 0 on inputs A and B cause a logic 1 output from NOR gate 29 which causes a logic 0 output from NOR gate 31 but activates AND gate 30 to connect the J input through AND gate 30 and OR gate 28 to the S input of AND gate 22. Thus, the R and S inputs of the flip-flop are essentially tied together in the J input.

Operation as a D flip-flop requires a logic 1 on the A input and a logic 0 on the B input. The logic 0 on the B input deactivates AND gate 27 to isolate input K from the flip-flop. The logic 1 on the A input causes a logic 0 output from NOR gate 29 to deactivate AND gate 30. With logic 0 outputs applied to two of the three inputs of NOR gate 31, this gate thus acts as an inverter connecting the J input through OR gate 28 to the S input of AND gate 22. Thus the J or R input of the flip-flop is connected through an inverter to the S input for operation as a D flip-flop.

Figure 2:
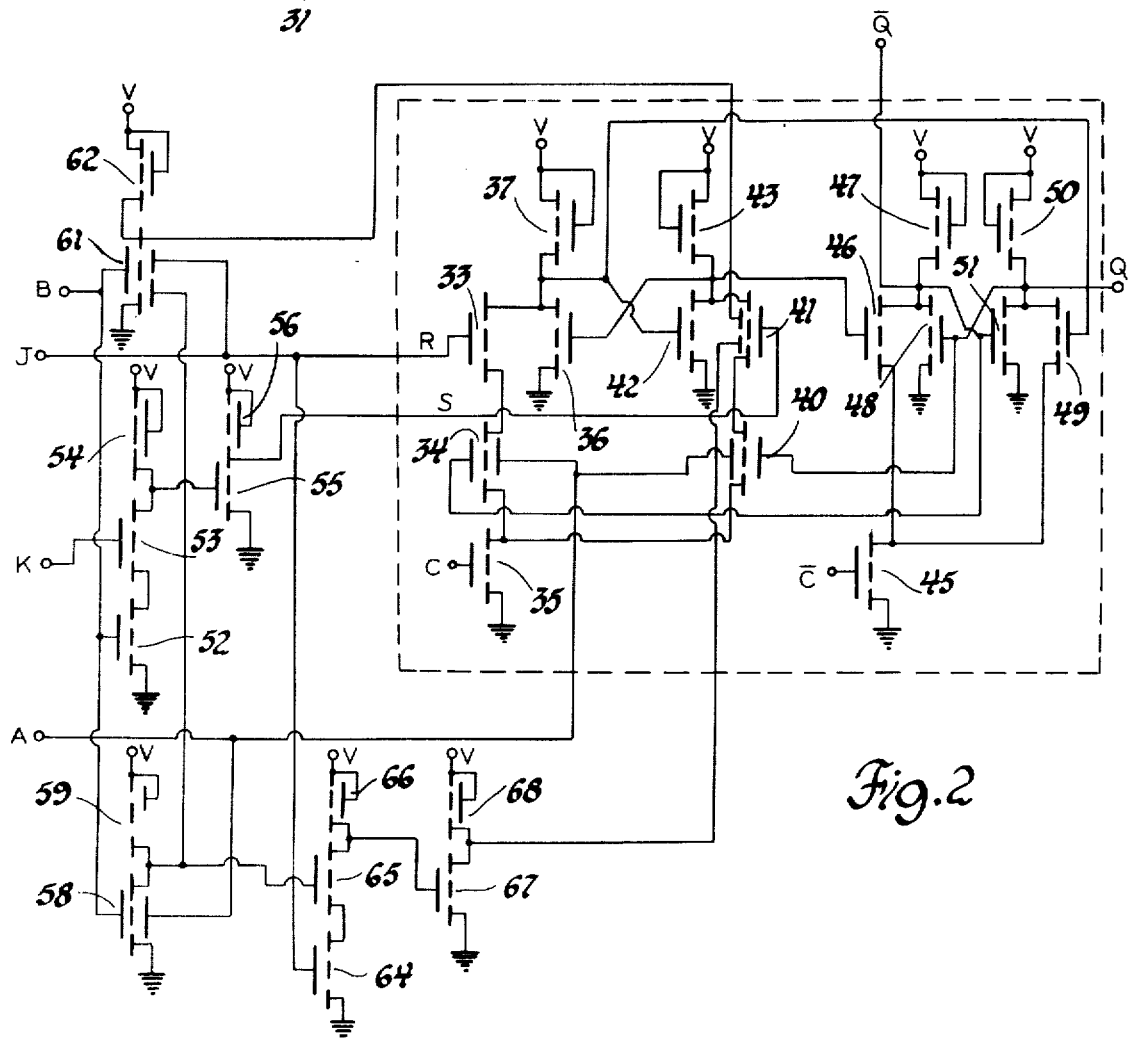
FIG. 2 is a circuit diagram of a preferred embodiment of the apparatus of FIG. 1.

FIG. 2 shows the circuit diagram of a physical embodiment of the logical circuit of FIG. 1 which is adapted for manufacture as a single integrated circuit using PMOS technology on an N-wafer. MOSFETS 33, 34 and 35 are connected in series with the source of MOSFET 35 grounded, the gate of MOSFET 35 connected to the clock input C, the gate of MOSFET 33 connected to the J input and the gates of MOSFET 34 connected to input A and output Q, respectively. These three MOSFETS are connected in parallel with MOSFET 36 having a grounded source and in series with MOSFET 37 having a drain and gate connected to a negative voltage power source V. The drain of MOSFET 35 is further connected in series with MOSFETS 40 and 41, MOSFET 40 having gates connected to input A and output $\overline{Q}$, respectively, and MOSFET 41 having a plurality of gates connected in a manner to be described at a later point in the specification. The drain of MOSFET 41 is further connected to the drain of a MOSFET 42 having a grounded source and to the source of a MOSFET 43 having a drain and gate connected to power source V. The drain of MOSFET 42 is further connected to the gate of MOSFET 36; while the drain of MOSFET 36 is connected to the gate of MOSFET 42.

MOSFETS 45, 46 and 47 are connected in series with the source of MOSFET 45 grounded, the gate of MOSFET 45 connected to clock input $\overline{C}$, the gate of MOSFET 46 connected to the drain of MOSFET 42, the drain of MOSFET 46 connected to output $\overline{Q}$ and the drain and gate of MOSFET 47 connected to power source V. A MOSFET 48 has a drain connected to the drain of MOSFET 46, a grounded source, and a gate connected to output Q and to a gate of MOSFET 40. A MOSFET 49 has a source connected to the drain of MOSFET 45, a gate connected to the drain of MOSFET 33 and a drain connected to the source of a MOSFET 50, which has a drain and gate connected to power source V. The drain of MOSFET 49 is further connected to the drain of a MOSFET 51 having a grounded source and a gate connected to the drain of MOSFET 48.

The above-described MOSFETS form the clocked, master-slave RS flip-flop 10 with MOSFETS 35, 34, 33 and 37 forming AND gate 21, MOSFETS 35, 40, 41 and 43 forming AND gate 22, MOSFETS 36 and 37 forming NOR gate 12, MOSFETS 42 and 43 forming NOR gate 13, MOSFETS 45, 46 and 47 forming AND gate 19, MOSFETS 45, 49 and 50 forming AND gate 18, MOSFETS 47 and 48 forming NOR gate 16 and MOSFETS 50 and 51 forming NOR gate 15.

MOSFETS 52, 53 and 54 are connected in series, the source of MOSFET 52 being grounded, the gate of MOSFET 52 being connected to input B, the gate of MOSFET 53 being connected to input K and the drain and gate of MOSFET 54 both being connected to power source V. MOSFETS 55 and 56 are connected in series with the source of MOSFET 55 grounded, the gate of MOSFET 55 connected to the source of MOSFET 54 and the drain and gate of MOSFET 56 both being connected to power source V. The source of MOSFET 56 is connected to a gate of MOSFET 41. MOSFETS 52 through 56 comprise AND gate 27; while OR gate 28 comprises MOSFET 41 with a plurality of input gates. The source of MOSFET 56 or the connected gate of MOSFET 41 may thus be identified as the S input of the flip-flop as shown in FIG. 1.

NOR gate 29 comprises a pair of MOSFETS 58 and 59 in series with the source of MOSFET 58 grounded, the drain and gate of MOSFET 59 both being connected to power source V and the gate of MOSFET 58 being connected to input B. NOR gate 31 comprises a pair of MOSFETS 61 and 62 in series with the source of MOSFET 61 grounded, the drain and gate of MOSFET 62 both being connected to power source V and a plurality of gates of MOSFET 61 being connected, respectively, to input B, the source of MOSFET 59 and input J. The source of MOSFET 62 is connected to another input gate of MOSFET 41.

MOSFETS 64, 65 and 66 are connected in series with the source of MOSFET 64 grounded, the gate of MOSFET 64 connected to input J, the gate of MOSFET 65 connected to the source of MOSFET 59 and the drain and gate of MOSFET 66 both being connected to power source V. A pair of MOSFETS 67 and 68 are connected in series with the source of MOSFET 67 grounded, the gate of MOSFET 67 being connected to the source of MOSFET 66, the drain and gate of MOSFET 68 both being connected to negative power source V and the source of MOSFET 68 being connected to an input gate of MOSFET 41. MOSFETS 64–68 comprise AND gate 30.

This completes a physical description of the circuit of FIG. 2. Its operation is similar, and should be apparent from the description of the operation of the logic circuit of FIG. 1. It will be apparent that MOSFETS in series between negative voltage power source V and ground generally comprise AND or NAND gates while a MOSFET having a plurality of gates comprises an OR or NOR gate. It should further be apparent that there is signal inversion in going through any of these gates so that an AND or OR gate requires an inverter on its output while a NAND or NOR gate does not. The operation of logic gates made from MOSFETS is well known in electrical circuit analysis and standard MOSFET equivalents are used in this embodiment. Further details of the manufacture of the circuit chip and the detailed operation of the various MOSFETS are not deemed necessary, as they should be apparent to those skilled in the art.

The embodiment shown and described above is a preferred embodiment; however, equivalent embodiments will occur to those skilled in the art. Therefore this invention should be limited only by the claims which follow.

The embodiments of the invention in which an exclusive property or privilege is claimed are defined as follows:

1. A signal programmable, multiple function flip-flop comprising, in combination:

elements comprising a clocked, RS masterslave flip-flop having Q and not-Q outputs and first and second input AND gates, the first AND gate having an R, a clock and another input and the second AND gate having an S, a clock and another input;

elements defining K, A and B inputs;

first gate means responsive to a first signal condition at the A input to connect the Q output to the other input of the second AND gate and the not-Q output to the other input of the first AND gate and further responsive to a second signal condition at the A input to disconnect the same;

second gate means responsive to a second signal condition on the B input to connect the K and S inputs together and further responsive to a first signal condition on the B input to disconnect the same;

third gate means responsive to a first signal condition on the A and B inputs to connect the R and S inputs together and further responsive to any other combination of signal conditions on the A and B inputs to disconnect the same;

inverter means; and fourth gate means responsive to the first signal condition on the B input and the second signal condition on the A input to connect the R input through the inverter means to the S input and further responsive to any other combination of signal conditions on the A and B inputs to disconnect the same, whereby the flip-flop may be selectively programmed to operate as an RS, JK, D or T flip-flop according to the combination of signal conditions on the A and B inputs.

2. A signal programmable, multiple function flip-flop comprising, in combination:

elements comprising a clocked, RS masterslave flip-flop having Q and not-Q outputs and first and second input AND gates, the first AND gate having an R, a clock and another input and the second AND gate having an S, a clock and another input;

elements defining K, A and B inputs;

a first OR gate having inputs connected to the A input and not-Q output, respectively, and an output connected to the other input of the first AND gate;

a second OR gate having inputs connected to the A input and Q output, respectively, and an output connected to the other input of the second AND gate;

a third OR gate having an output connected to the S input of the second AND gate;

a third AND gate having inputs connected, respectively, to the K and B inputs and an output connected to an input of the third OR gate;

a first NOR gate having inputs connected, respectively, to the A and B inputs;

a fourth AND gate having inputs connected, respectively, to the R input of the first AND gate and the output of the first NOR gate and an output connected to an input of the third OR gate; and a second NOR gate having inputs connected, respectively, to the R input of the first AND gate, the output of the first NOR gate and the B input and an output connected to an input of the third OR gate, whereby the flip-flop assumes the operational characteristics of an RS, JK, D or T flip-flop for input data signals on the R and K inputs according to control signals on the A and B inputs.

* * * * *